United States Patent

Fukui et al.

Patent Number: 5,891,601
Date of Patent: Apr. 6, 1999

[54] POSITIVE RESIST COMPOSITION

[75] Inventors: Nobuhito Fukui; Yuko Yako; Hiroshi Takagaki; Kenji Takahashi, all of Osaka, Japan

[73] Assignee: Sumitomo Chemical Company, Ltd., Osaka, Japan

[21] Appl. No.: 950,586

[22] Filed: Oct. 15, 1997

[30] Foreign Application Priority Data

Oct. 16, 1996 [JP] Japan ................ 8-273333
Feb. 27, 1997 [JP] Japan ................ 9-043778

[51] Int. Cl.$^6$ ................ G03F 7/004
[52] U.S. Cl. ................ 430/170; 430/270.1; 430/905
[58] Field of Search ................ 430/170, 270.1, 430/905

[56] References Cited

U.S. PATENT DOCUMENTS

| | | | |
|---|---|---|---|
| 5,320,931 | 6/1994 | Umehara et al. | 430/270.1 |
| 5,403,695 | 4/1995 | Hayase et al. | 430/192 |
| 5,658,706 | 8/1997 | Niki et al. | 430/270.1 |

FOREIGN PATENT DOCUMENTS 0397474  11/1990  European Pat. Off. .

*Primary Examiner*—John S. Chu
*Attorney, Agent, or Firm*—Birch, Stewart, Kolasch & Birch, LLP

[57] ABSTRACT

A positive photo resist composition of chemical amplifying type, which is excellent in various properties such as sensitivity, resolution, heat resistance, film retention ratio, applicability and profile and also excellent in time delay effect resistance, and which comprises (A) a resin which is converted to alkali-soluble from alkali-insoluble or alkali-slightly soluble by the action of an acid, (B) an acid generator and (C) a dipyridyl compound represented by the following formula (I):

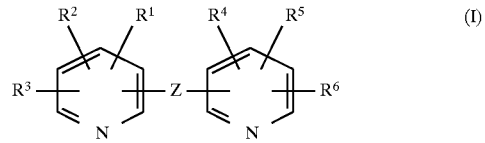

wherein, Z represents an organic bonding group having least one hetero atom, and $R^1$, $R^2$, $R^3$, $R^4$, $R^5$ and $R^6$ each independently represent hydrogen or an alkyl group having 1 to 4 carbon atoms.

8 Claims, No Drawings

POSITIVE RESIST COMPOSITION

The present invention relates to a chemical amplifying type positive resist composition suitable for lithography, which uses a high energy radiation such as a far ultraviolet ray (including eximer laser and the like), electron beam, X-ray or radiation light.

Recently, with increasing in degree of integration of an integrated circuit, submicron pattering is required. In particular, eximer laser lithography is drawing attention since it enables production of 64M DRAM (megabit random access memory) and 256M DRAM. As a resist suitable for such an eximer laser lithography process, there is suggested a so-called chemical amplifying type resist utilizing an acid catalyst and chemical amplifying effect. In a chemical amplifying type resist, the solubility of irradiated parts against an alkali developer is changed by a reaction utilizing an acid, as catalyst, generated from an acid generator by irradiation. A positive or negative pattern is obtained by this reaction.

In a chemical amplifying type resist, an acid generated in the irradiated parts is diffused in the subsequent thermal treatment (post exposure bake: hereinafter abbreviated as PEB) and acts as a catalyst to change the solubility of irradiated parts against a developer. However, there is a problem that this chemical amplifying type resist is liable to be influenced by circumstances. For example, the performances of the resist varies depending on leaving time from irradiation to PEB. This phenomenon is called time delay effect. The time delay effect lowers the resolution. Further more, due to the time delay effect, a slightly soluble layer against an alkali developer is formed on the surface of a resist film and, as a result, a pattern after developing become T-shape which deteriorates reproducibility of dimension of the pattern. The time delay effect is said to be caused by deactivation of an acid generated in a resist due to small amount of amines existing in surrounding atmosphere, etc.

For suppressing the time delay effect, namely to promote time delay effect resistance (hereinafter, referred to as TDE resistance), it is known to add a nitrogen-containing compound as a quencher to a chemical amplifying type positive resist. Though TDE resistance increases to a certain extent by the addition of a nitrogen-containing compound as a quencher, the increase of the TDE resistance, profile and resolution are still insufficient for a conventionally known resist composition.

The object of the present invention is to provide a chemical amplifying type positive photo resist composition, which is good in various properties such as sensitivity, resolution, heat resistance, film remaining ratio, applicability and profile as well as is excellent in TDE resistance. The present inventors have intensively studied to attain said object, and as a result, have found that said object can be attained by a positive photo resist composition obtained by combination of specific components. Thus, the present invention was completed.

The present invention provides a positive photo resist composition comprising
(A) a resin which is converted to alkali-soluble from alkali-insoluble or alkali-slightly soluble by the action of an acid, (B) an acid generators and (C) a dipyridyl compound represented by the following formula (I):

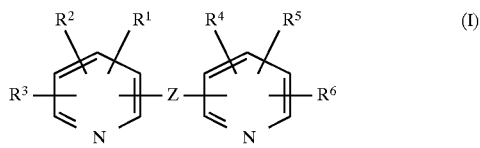

wherein Z represents an organic bonding group having at least one hetero atom, and $R^1$, $R^2$, $R^3$, $R^4$, $R^5$ and $R^6$ each independently represent hydrogen or an alkyl group having 1 to 4 carbon atoms.

By containing the dipyridyl compound (C) represented by the above-described formula (I) in the positive photo resist composition, its resolution, profile and TDE resistance are particularly improved. Further, it is also effective for the positive photo resist composition to comprise an electron donor (D) having an oxidation-reduction potential of not more than 1.7 eV in addition to the above-described three components (A), (B) and (C).

The resin (A), which is a main component of the photo resist composition, is insoluble or slightly soluble itself against an alkali. However, it becomes alkali soluble by chemical reaction caused by an action of an acid. Examples of the resin (A) include a resin which is produced from an alkali-soluble resin having a phenol skeleton by protecting at least a part of the phenolic hydroxyl groups by a group which has dissolution inhibiting ability against an alkali developer and is instable against an acid.

Examples of the alkali-soluble resin which is used for producing the resin (A) include novolak resins, polyvinylphenol resin, polyisopropenylphenol resin, copolymers of vinylphenol with styrene, acrylonitrile, methylmethacrylate or methylacrylate, and copolymers of isopropenylphenol with styrene, acrylonitrile, methylmethacrylate or methylacrylate. Although the relative positional relation between a hydroxyl group and a vinyl group or an isopropenyl group in vinylphenol and isopropenylphenol is not particularly limited, in general p-vinylphenol or p-isopropenylphenol is preferred. These resins may be hydrogenated to improve transparency. Further, an alkyl group or alkoxyl group may be introduced into the phenol nucleus of the above-described resin as long as the resin is alkali-soluble. Among these alkali-soluble resins, polyvinylphenol-based resins, namely, a homopolymer of vinylphenol or copolymers of vinylphenol with the other monomers are preferably used.

The group which has dissolution inhibiting ability against an alkali developer and is instable against an acid, which is introduced in the alkali-soluble resin, can be selected from various known protecting groups. Examples thereof include tert-butoxycarbonyl group, tert-butoxycarbonylmethyl group, tetrahydro-2-pyranyl group, tetrahydro-2-furyl group, methoxymethyl group and 1-ethoxyethyl group. Among these protecting groups, 1-ethoxyethyl group is particularly preferred in the present invention. The hydrogen atoms of the phenolic hydroxyl group of an alkali-soluble resin having a phenol skeleton is substituted by one of these protecting groups. The ratio of phenolic hydroxyl groups which are substituted by a protecting group to total phenolic groups (protecting group introduction ratio) in the alkali-soluble resin is preferably from 10 to 50% in general.

In the present invention, it is preferable that at least a part of resin(A) is polyvinylphenol-based resin in which the phenolic hydroxyl group is partially protected by a group which has dissolution inhibiting ability against an alkali developer and is instable against an acid, particularly preferable by 1-ethoxyethyl group.

The acid generator (B) can be selected from various compounds which generate acid by irradiating a radiation.

The acid generator (B) can be used singly or as a mixture of two or more thereof. Examples thereof include onium salts, organic halogen compounds, compounds containing a diazomethanedisulfonyl skeleton, disulfone-based compounds, orthoquinonediazide compound and sulfonic acid-based compounds. Among them, compounds containing a diazomethanedisulfonyl skeleton, disulfone-based compounds and sulfonic acid-based compounds are preferred in the present invention.

Examples of the compounds having a diazomethanedisulfonyl skeleton usable as the acid generator (B) include bis(cyclohexylsulfonyl) diazomethane, bis(phenylsulfonyl) diazomethane, bis(p-tolylsulfonyl) diazomethane and bis(2,4-xylylsulfonyl) diazomethane. Examples of the disulfone-based compound usable as the acid generator (B) include diphenyl disulfone, di-p-tolyl disulfone, phenyl p-tolyl disulfone and phenyl p-methoxyphenyl disulfone.

Examples of the sulfonic acid-based compound usable as the acid generator (B) include esters of alkysulfonic acids, esters of haloalkylsulfonic acids, esters of arylsulfonic acids and esters of camphorsulfonic acids. Examples of alcohol moiety of the above-described esters include pyrogallol, 2- or 4-nitrobenzyl alcohol, 2,6-dinitrobenzyl alcohol, N-hydroxyimide compounds and oxime-based compounds. Examples of the sulfonic acid-based compounds usable as the acid generator (B) further include N-(phenylsulfonyloxy)succinimide, N-(methylsulfonyloxy) succinimide, N-(trifluoromethylsulfonyloxy) succinimide, N-(ethylsulfonyloxy) succinimide, N-, butylsuofonyloxy) succinimide, N-(10-camphorsulfonyloxy) succinimide, N-(trifluoromethylsulfonyloxy) phthalimide, N-(trifluoromethylsulfonyloxy) naphthalimide, 2-nitrobenzyl p-toluenesulfonate, 4-nitrobenzyl p-toluenesulfonate, 2,6-dinitrobenzyl p-toluenesulfonate, 1,2,3-benzenetriyl trismethanesulfonate, 1-benzoyl-1-phenylmethyl p-toluenesulfonate (so-called benzointosylate), 2-benzoyl-2-hydroxy-2-phenylethyl p-toluenesulfonate (so-called α-methlolbenzointosylate) and α-(p-tolylsulfonyloxyimino)-4-methoxyphenylacetonitrile.

The photo resist composition of the present invention comprises a dipyridyl compound (C) represented by the formula (I) as a quencher in addition to the above-described resin (A) and the acid generator (B). In the formula (I), Z is an organic bonding group having at least one hetero atom which is, for example, a nitrogen atom, oxygen atom or sulfur atom. Specific examples of the organic bonding group represented by Z include an imino group (—NH—), iminobismethylene group (—CH$_2$NHCH$_2$—), carbonyl group (—CO—), carbonate residue (—OCOO—), ethylene glycol residue (—OCH$_2$CH$_2$O—), sulfide group (—S—), disulfide group (—S—S—), sulfinyl group (—SO—) and sulfonyl group (—SO$_2$—). $R^1$, $R^2$, $R^3$, $R^4$, $R^5$ and $R^6$ in the formula (I) respectively represent hydrogen or an alkyl group having 1 to 4 carbon atoms. Compounds in which two or three of $R^1$, $R^2$ and $R^3$ are hydrogen and two or three of $R^4$, $R^5$ and $R^6$ are hydrogen, particularly compounds in which all of $R^1$, $R^2$, $R^3$, $R^4$, $R^5$ and $R^6$ are hydrogen, are easily available.

Typical examples of the compounds represented by the formula (I) include 2,2'-dipyridylamine, 2,2'-dipicolylamine, 3,3'-dipicolylamine, di-2-pyridyl ketone, di-2-pyridylcarbonate, DL-α,β-di(4-pyridyl) glycol, 4,4'-dipyridylsulfide and 2,2'-dipyridyldisulfide. Among them, 2,2'-dipyridylamine, di-2-pyridyl ketone, 4,4'-dipyridylsulfide and 2,2'-dipyridyldisulfide are preferred.

The positive resist composition of the present invention essentially comprises the above-described resin (A), acid generator (B) and dipyridyl compound (C). The positive photo resist composition of the present invention may further contain the other additional components. As the additional component, an electron donor (D) is preferably used. Among the electron donor (D), an electron donor having a oxidation-reduction potential of not more than 1.7 eV is particularly preferred. Examples of the electron donor include condensed polycyclic aromatic compounds and hetero polycyclic aromatic compounds. Examples of the more preferred electron donor include 2- hydroxylcarbazol, β-naphthol, 4-methoxynaphthol and indol acetic acid. These electron donors can be used alone or in combination of two or more. The decomposition reaction of the acid generator (B) caused by electron transfer is often promoted by the existence of the electron donor in a certain composition.

The composition ratio of the resin (A) in the positive photo resist composition of the present invention is preferably 20 to 98% by weights, more preferably 75 to 98% by weight, based on weight of the total solid component of the composition. The composition ratio of the acid generator (B) in the positive photo resist composition is preferably 0.05 to 20% by weight based on weight of the total solid component of the composition. The composition ratio of the dipyridyl compound (C) in the positive photo resist composition is preferably 0.001 to 10% by weight based on weight of the total solid component of the composition. When the electron donor (D) is used, the composition ratio of the electron donor (D) in the positive photo resist composition is 0.001 to 10% by weight based on the total solid component weight of the composition. The photo resist composition of the present invention may further optionally contain various additives conventionally used in this field such as dissolution inhibitor, sensitizers dyes or adhesion improvers.

A resist solution is prepared by mixing the above-described components with a solvent so that the total solid component concentration is from 10 to 50% by weight. The solution thus prepared is applied on a substrate such as a si silicon wafer. The solvent herein used may be one which can solve the all of the components, and can be one which is generally used in this field. Examples thereof include glycol ether esters such as ethylcellosolve acetate, methylcellosolve acetate, propylene glycolmonomethyl ether acetate and propylene glycol monoethyl ether acetate, glycol mono or diethers such as ethylcellosolve, methylcellosolve, propylene glycol monomethyl ether, propylene glycol monoethyl ether and diethylene glycol dimethyl ether, esters such as ethyl lactate, butyl acetate and ethyl pyruvate, ketones such as 2-heptanone, cyclohexanone and methyl isobutyl ketone, and aromatic hydrocarbons such as xylene. These solvents can be used alone or in combination of two or more.

From the resultant resist film applied on a substrate, positive pattern is formed generally via subsequent processes such as prebake, patterning exposure, PEB, and developing by an alkali developer. In the alkali developing, various alkaline aqueous solutions used in this field can be used. And in general, aqueous solutions such as tetramethylammoniumhydroxide and (2-hydroxyethyl) tetramethylammoniumhydroxide (so-called choline hydroxide) are often used.

The following examples further illustrate the present invention in detail but are not to be construed to limit the scope thereof. In the examples, all parts are by weight unless otherwise state.

REFERENCE EXAMPLE 1
(protection of resin)

Into a 500 ml four-necked flask purged with nitrogen were charged 25 g of poly (p-vinylphenol) ["VP-5000" manufactured by Nippon Soda K.K.] having a weight average molecular weight (Mw) of 8400 and a dispersion degree (Mw/Mn) of 1.19 (208 mmol as p-vinylphenol unit) and 0.024 g (0.125 mmol) of p-toluenesulfonic acid, and they were dissolved in 250 g of 1,4-dioxane. To this solution was added dropwise 9.0 g (125 mmol) of ethylvinyl ether, and then reaction was carried out for 5 hours at 25° C. This reaction solution was added dropwise into 1500 ml of ion-exchanged water, then separated by filtration to obtain a white wet cake. This wet cake was dissolved again in 200 g of 1,4-dioxane, and the resulting solution was added dropwise into 1500 ml of ion-exchanged water. The resulting mixture was separated by filtration. The wet cake thus obtained was washed by being stirred with 600 g of ion-exchanged water, followed by being filtered to obtain a wet cake. The washing operation with this ion-exchanged water was further repeated twice. The resulting white wet cake was dried under reduced pressure to obtain a resin in which the hydroxyl group of poly (p-vinylphenol) was partially 1-ethoxyethyl etherized. This resin was analyzed by $^1$H-NMR to find that 40% of the hydroxyl group was protected by a 1-ethoxylethyl group. This resin has a weight average molecular weight of 12300 and a dispersion degree of 1.23.

REFERENCE EXAMPLE 2

The same procedure as in Reference Example 1 was repeated except that poly (p-vinylphenol)[ "VP-15000" manufactured by Nippon Soda K.K.] having a weight average molecular weight of 23900 and a dispersion degree of 1.12 was used in the same amount instead of "VP-5000", the amount of p-toluenesulfonic acid was changed to 0.021 g (0.109 mmol) and the amount of ethylvinyl ether was changed to 7.88 g (109 mmol), to obtain a resin in which the hydroxyl group of poly (p-vinylphenol) was partially 1-ethoxyethyl etherized. This resin was analyzed by $^1$H-NMR to find that 35% of the hydroxyl group was protected by a 1-ethoxylethyl group. This resin has a weight average molecular weight of 31200 an d a dispersion degree of 1.17.

EXAMPLE 1

The resin synthesized in Reference Example 1 (13.5 parts), 1.0 part of N-(10-camphorsulfonyloxy) succinimide as an acid generator and 0.015 parts of 2,2'-dipyridylamine were dissolved in 65 parts of propylene glycol monomethyl ether acetate. This solution was filtered through a filter made of a fluorine resin having a pore diameter of 0.1 μm to prepare a resist solution.

On a silicone wafer washed by conventional way, the above-described resist solution was applied using a spin coater so that a film thickness after drying is 0.7 μm. Then, this silicon wafer was prebaked at 90° C. for 90 seconds on a hot plate. The film after the prebake was subjected to irradiation treatment using KrF eximer laser stepper ("NSR-1755 EX8A" manufactured by Nikon Corp., NA=0.45) having an irradiation wave length of 248 nm through a chromium mask having a pattern with changing irradiation amount stepwise. Immediately, or after left for 30 minutes in a clean room having an amine concentration of 2 to 3 ppb, the irradiated wafer was heated for 90 seconds at 100° C. on a hot plate for carrying out PEB to conduct deprotection reaction in the irradiated parts. This was developed with a 2.38% by weight aqueous solution of tetramethylammoniumhydroxide to obtain a positive pattern.

The formed pattern was observed by an electron microscope. Regarding the sample which was subjected to PEB immediately after irradiation, 0.23 μm fine pattern with excellent profile was formed at a irradiation amount of 40 mJ/cm². Regarding the sample which was subjected to PEB after left for 30 minutes after irradiation, 0.23 μm fine pattern with excellent profile was formed at a Irradiation amount of 40 mJ/cm² likewise.

EXAMPLE 2

The resin synthesized in Reference Example 1(13.5 parts), 1.0 part of N-(10-camphorsulfonyloxy) succinimide as an acid generator and 0.015 parts of di-2-pyridyl ketone were dissolved in 65 parts of propylene glycol monomethyl ether acetate. This solution was filtered through a filter made of a fluorine resin having a pore diameter of 0.1 μm to prepare a resist solution. The same procedure as in Example 1was repeated using this resist solutions and the formed pattern was observed by an electron microscope. Regarding the sample which was subjected to PEB immediately after irradiation, 0.22 μm fine pattern with excellent profile was formed at a irradiation amount of 38 mJ/cm². Regarding the sample which was subjected to PEB after left for 30 minutes after irradiation, 0.22 μm fine pattern with excellent profile was formed at a irradiation amount of 38 mJ/cm²likewise.

EXAMPLE 3

The resin synthesized in Reference Example 1 (13.5 parts), 1.0 part of N-(10-camphorsulfonyloxy) succinimide as an acid generator, 0.025 parts of di-2-pyridyl ketone and 0.2 parts of 2-hydroxycarbazole as an electron donor were dissolved in 65 parts of propylene glycol monomethyl ether acetate. This solution was filtered through a filter made of a fluorine resin having a pore diameter of 0.1 μm to prepare a resist solution. The same procedure as in Example 1 was repeated using this resist solution, and the formed pattern was observed by an electron microscope. Regarding the sample which was subjected to PEB immediately after irradiation, 0.22 μm fine pattern with excellent profile was formed at a irradiation amount of 30 mJ/cm². Regarding the sample which was subjected to PEB after left for 30 minutes after irradiation, 0.22 μm fine pattern with excellent profile was formed at a irradiation amount of 30 mJ/cm² likewise.

Comparative Example 1

There resin synthesized in Reference Example1 (13.5parts), 1.0 part of N-(10-camphorsulfonyloxy) succinimide as an acid generator and 0.02 parts of 2,2'-bipyridyl were dissolved in 65 parts of propylene glycol monomethyl ether acetate. This solution was filtered through a filter made of a fluorine resin having a pore diameter of 0.1 μm to prepare a resist solution. Application on a silicon wafer, prebake and patterning irradiation were conducted in the same manner as in Example 1 using this resist solution. PEB was conducted for 90 seconds at 100° C. on a hot plate immediately after irradiation, and developing was then conducted in the same manner as in Example 1. The formed pattern was observed by an electron microscope. As a result, though 0.24 μm fine pattern was formed at a irradiation amount of 40 mJ/cm², reduction in film thickness was extreme and profile was poor.

EXAMPLE 4

The resin-synthesized in Reference Example2 (13.5 parts), 0.5 part of N(n-butylsulfonyloxy) succinimide as an acid generator, 0.025 parts of di-2-pyridyl ketone and 0.2 parts of 2-hydroxycarbazole as an electron donor were dissolved in 70 parts of propylene glycol monomethyl ether acetate. This solution was filtered through a filter made of a fluorine resin having a pore diameter of 0.1 μm to prepare a resist solution. The same procedure as in Example 1 was repeated using this resist solution, and the formed pattern was observed by an electron microscope. Regarding the sample which was subjected to PEB immediately after irradiation, 0.23 μm fine pattern with excellent profile was formed at a irradiation amount of 26 mJ/cm$^2$. Regarding the sample which was subject to PEB after left for 30 minutes after irradiation, 0.23 μm fine pattern with excellent profile was formed at a irradiation amount of 26 mJ/cm$^2$ likewise.

EXAMPLE 5

The resin synthesized in Reference Example 2 (13.5 parts), 0.5 part of bis(cyclohexylsulfonyl) diazomethane as an acid generator, 0.007 parts of di-2-pyridyl ketone and 0.2 parts of 2-hydroxycarbazole as an electron donor were dissolved in 70 parts of propylene glycol monomethyl ether acetate. This solution was filtered through a filter made of a fluorine resin having a pore diameter of 0.1 μm to prepare a resist solution. The same procedure as in Example 1 was repeated using this resist solution, and the formed pattern was observed by an electron microscope. Regarding the sample which was subjected to PEB immediately after irradiation, 0.23 μm fine pattern with excellent profile was formed at a irradiation amount of 50 mJ/cm$^2$. Regarding the sample which was subjected to PEB after left for 30 minutes after irradiation, 0.23 μm fine pattern with excellent profile was formed at a irradiation amount of 50 mJ/cm$^2$ likewise.

EXAMPLE 6

The resin synthesized in Reference Example 2 (13.5 parts), 0.5 part of bis(cyclohexylsulfonyl) diazomethane as an acid generator and 0.01 part of di-2-pyridyl ketone were dissolved in 70 parts of propylene glycol monomethyl ether acetate. This solution was filtered through a filter made of a fluorine resin having a pore diameter of 0.1 μm to prepare a resist solution. The same procedure as in Example 1 was repeated using this resist solution, and the formed pattern was observed by an electron microscope. Regarding the sample which was subjected to PEB immediately after irradiation, 0.22 μm fine pattern with excellent profile was formed at a irradiation amount of 40 mJ/cm$^2$. Regarding the sample which was subjected to DEB after left for 30 minutes after irradiation, 0.22 μm fine pattern with excellent profile was formed at a irradiation amount of 40 mJ/cm$^2$ likewise.

EXAMPLE 7

The resin synthesized in Reference Example 2 (13.5 parts), 0.5 part of bis(cyclohexylsulfonyl) diazomethane as an acid generator and 0.007 part of 4,4'-dipyridylsulfide were dissolved in 70 parts of propylene glycol monomethyl ether acetate. This solution was filtered through a filter made of a fluorine resin having a pore diameter of 0.1 μm to prepare a resist solution. The same procedure as in Example 1 was repeated using this resist solution, and the formed pattern was observed by an electron microscope. Regarding the sample which was subjected to PEB immediately after irradiation, 0.23 μm fine pattern with excellent profile was formed at a irradiation amount of 37 mJ/cm$^2$. Regarding the sample which was subjected to PEB after left for 30 minutes after irradiation, 0.23 μm fine pattern with excellent profile was formed at a irradiation amount of 37 mJ/cm$^2$ likewise.

EXAMPLE 8

The resin synthesized in Reference Example 2 (13.5 parts), 0.5 part of bis(cyclohexylsulfonyl) diazomethane as an acid generator and 0.01 part of 2,2'-dipyridyldisulfide were dissolved in 70 parts of propylene glycol monomethyl ether acetate. This solution was filtered through a filter made of a fluorine resin having a pore diameter of 0.1 μm to prepare a resist solution. The same procedure as in Example 1 was repeated using this resist solution, and the formed pattern was observed by an electron microscope. Regarding the sample which was subjected to PEB immediately after irradiation, 0.23 μm fine pattern with excellent profile was formed at a irradiation amount of 36 mJ/cm$^2$. Regarding the sample which was subjected to PEB after left for 30 minutes after irradiation, 0.23 μm fine pattern with excellent profile was formed at a irradiation amount of 36 mJ/cm$^2$ likewise.

Comparative Example 2

The resin synthesized in Reference Example 2 (13.5 parts), 0.5 part of bis(cyclohexylsulfonyl) diazomethane as an acid generator and 0.01 part of 2,2'-bipyridyl were dissolved in 70 parts of propylene glycol monomethyl ether acetate. This solution was filtered through a filter made of a fluorine resin having a pore diameter of 0.1 μm to prepare a resist solution. Application on a silicon wafer, prebake and patterning irradiation were conducted in the same manner as in Example 1 using this resist solution. PEB was conducted for 90 seconds at 100° C. on a hot plate immediately after irradiation, and developing was then conducted in the same manner as in Example 1. The formed pattern was observed by an electron microscope. As a result, though 0.26 μm fine pattern was formed at a irradiation amount of 42 mJ/cm$^2$, reduction in film thickness was extreme and profile was poor.

REFERENCE EXAMPLE 3
(protection of resin )

Into a 1 liter eggplant shape flask were charged 40 g of poly (p-vinylphenol)["VP-15000" manufactured by Nippon Soda K.K.] having a weight average molecular weight of 23900 and a dispersion degree of 1.12 (333 mmol as p-vinylphenol unit) and 0.047 g (0.5 mmol) of p-toluenesulfonic acid, and they were dissolved in 720 g of propylene glycol monomethyl ether acetate. This solution was distilled at 60° C. under a pressure of not more than 10 Torr, and was dehydrated under azeotropic distillation. The weight of the solution after the distillation was 337 g. This solution was transferred to a 500 ml four-necked flask purged with nitrogen. Thereto, 12.0 g (166 mmol) of ethylvinyl ether was added dropwise, and, then, reaction was conducted at 25° C. for 5 hours. To this reaction solution were added 62.3 g of propylene glycol monomethyl ether acetate and 320 g of methylisobutyl ketone, and further 240 ml of ion-exchanged water. The resulting mixture was stirred and, then allowed to stand still to take out an organic layer portion. To this organic layer 240 ml of ion-exchanged water was added again, and the mixture was stirred for washing, followed by separation. This washing and separation was repeated twice, then the organic layer was taken out and subjected to distillation under reduced pressure. Then, azeotropic distillation with propylene glycol monomethyl ether acetate was conducted to remove water and methyl isobutyl ketone to obtain a propylene glycol monomethyl ether acetate solution. The resulting solution contained a resin in which the hydroxyl group of poly (p-vinylphenol) was partially 1-ethoxyethyl etherized. This resin was analyzed by $^1$H-NMR to find that 40% of the hydroxyl group was protected by a 1-ethoxyethyl group. This resin has a weight average molecular weight of 31200 and a dispersion degree of 1.23.

EXAMPLE 9

The resin synthesized in Reference Example 3 (14 parts), 0.25 part of diphenyldisulfone as an acid generator and 0.02 parts of 2,2'-dipyridylamine were dissolved in 70 parts of propylene glycol monomethyl ether acetate. This solution was filtered through a filter made of a fluorine resin having a pore diameter of 0.1 μm to prepare a resist solution.

On a silicone wafer washed by conventional way the above-described resist solution was applied by using a spin coater so that the film thickness after drying is 0.72 μm. Then, this silicon wafer was prebaked at 90° C. for 60 seconds on a hot plate. The film after the prebake was subjected to irradiation treatment using KrF eximer laser stepper ("NSR-1755 EX8A" manufactured by Nikon Corp., NA=0.45) having an irradiation wave length of 248 nm through a chromium mask having a pattern with changing irradiation amount stepwise. The wafer after irradiation was heated for 60 seconds at 100° C. on a hot plate for carrying out PEB. This was developed with a 2.38% by weight aqueous solution of tetramethylammoniumhydroxide to obtain a positive pattern. The formed pattern was observed by an electron microscope. As a result, the sensitivity was 29 mJ/cm$^2$ and the resolution was 0.23 μm. The profile was excellent.

EXAMPLE 10

The resin synthesized in Reference Example 3 (14 parts), 0.25 part of α-methylolbenzointosylate ["MBZ-101" manufactured by Midori Chemical K.K.] having the following structure:

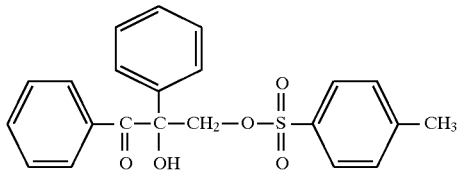

as an acid generator and 0.02 parts of 2,2'-dipyridylamine were dissolved in 70 parts of propylene glycol monomethyl ether acetate. This solution was filtered through a filter made of a fluorine resin having a pore diameter of 0.1 μm to prepare a resist solution. The same procedure as in Example 9 was repeated using this resist solution, and the formed pattern was observed by an electron microscope. As a result, the sensitivity was 60 mj/cm$^2$ and the resolution was 0.23 μm. The profile was excellent.

EXAMPLE 11

The resin synthesized in Reference Example 3 (14 parts), 0.25 part of α-(p-tolylsulfonyloxylimino)-4-methoxyphenylacetonitrile ["PAI-101" manufactured by Midori Chemical K.K.], having the following structure:

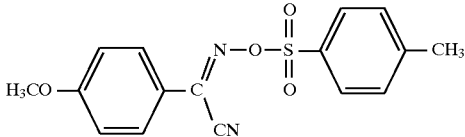

as an acid generator and 0.02 parts of 2,2'-dipyridylamine were dissolved in 70 parts of propylene glycol monomethyl ether acetate. This solution was filtered through a filter made of a fluorine resin having a pore diameter of 0.1 μm to prepare a resist solution. The same procedure as in Example 9 was repeated using this resist solution, and the formed pattern was observed by an electron microscope. As a result, the sensitivity was 20 mJ/cm$^2$ and the resolution was 0.25 μm. The profile was excellent.

Comparative Example 3

The resin synthesized in Reference Example 3 (14 parts), 0.25 part of diphenyldisulfone as an acid generator and 0.02 parts of 2,2'-bipyridyl were dissolved in 70 parts of propylene glycol monomethyl ether acetate. This solution was filtered through a filter made of a fluorine resin having a pore diameter of 0.1 μm to prepare a resist solution. The same procedure as in Example 7 was repeated using this resist solution, and the formed pattern was observed by an electron microscope. As a result, the sensitivity was 35 mJ/cm$^2$ and the resolution was 0.28 μm.

The compositions used in the above-described Examples 1 to 11 and Comparative Example 1 to 3 and the test results thereof are summarized in Table 1. In Table 1, components are represented by the following marks.

(A) Resin
A1: resin synthesized in Reference Example 1
A2: resin synthesized in Reference Example 2
A3: resin synthesized in Reference Example 3
(B) Acid generator
B1: N-(10-camphorsulfonyloxy) succinimide
B2: N-(n-butylsulfonyloxy) succinimide
B3: bis(cyclohexylsulfonyl) diazomethane
B4: diphenyldisulfone
B5: α-methylolbenzointosylate
B6: α-(p-tolylsulfonyloxyimino)-4-methoxyphenylacetonitrile
(C) Dipyridyl compound
C1: 2,2'-dipyridylamine
C2: di-2-pyridyl ketone
C3: 4,4'-dipyridylsulfide
C4: 2,2'-dipyridyldisulfide
CA: 2,2'-bipyridyl
(D) Electron donor
D1: 2-hydroxycarbazole

TABLE 1

| Example No. | Resin (parts) | Acid generator (parts) | di-pyridyl compound (parts) | Electron donor (parts) | Sensitivity (mJ/cm$^2$) | Resolution (μm) |
|---|---|---|---|---|---|---|
| Example 1 | A1/13.5 | B1/1.0 | C1/0.015 | — | 40 | 0.23 |
| Example 2 | A1/13.5 | B1/1.0 | C2/0.015 | — | 36 | 0.22 |
| Example 3 | A1/13.5 | B1/1.0 | C2/0.025 | D1/0.2 | 30 | 0.22 |
| Comparative example 1 | A1/13.5 | B1/1.0 | CA/0.02 | — | 40 Reduction in film thickness is extreme | 0.24 |
| Example 4 | A2/13.5 | B2/0.5 | C2/0.025 | D1/0.2 | 26 | 0.23 |
| Example 5 | A2/13.5 | B3/0.5 | C2/0.007 | D1/0.2 | 50 | 0.23 |
| Example 6 | A2/13.5 | B3/0.5 | C2/0.01 | — | 40 | 0.22 |
| Example 7 | A2/13.5 | B3/0.5 | C3/0.007 | — | 37 | 0.23 |
| Example 8 | A2/13.5 | B3/0.5 | C4/0.01 | — | 36 | 0.23 |
| Comparative example 2 | A2/13.5 | B3/0.5 | CA/0.01 | — | 42 Reduction in film thickness is extreme | 0.26 |
| Example 9 | A3/14 | B4/0.25 | C1/0.02 | — | 29 | 0.23 |
| Example 10 | A3/14 | B5/0.25 | C1/0.02 | — | 60 | 0.23 |
| Example 11 | A3/14 | B6/0.25 | C1/0.02 | — | 20 | 0.25 |
| Comparative example 3 | A3/14 | B4/0.25 | CA/0.02 | — | 35 | 0.28 |

The photo resist composition comprising the dipyridyl compound represented by the formula (I) is not easily influenced by circumstances, gives high sensitivity, excellent resolution and excellent profile when irradiated by a high energy radiation such as a far ultraviolet ray (including eximer laser) electron beam, X-ray and radiation light, and can form highly precise fine photo resist pattern.

What is claimed is:

1. A positive photo resist composition comprising
   (A) a resin which is converted to alkali-soluble from alkali-insoluble or alkali-slightly soluble by the action of an acid,
   (B) an acid generator, and
   (C) a dipyridyl compound represented by the following formula (I):

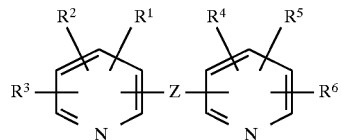

wherein Z represents an organic bonding group having at least one hetero atom, and $R^1$, $R^2$, $R^3$, $R^4$, $R^5$ and $R^6$ each independently represent hydrogen or an alkyl group having 1 to 4 carbon atoms.

2. The composition according to claim 1, wherein the resin (A) comprises a polyvinyl phenol-based resin in which the phenolic hydroxyl group is partially protected by a group which has dissolution inhibiting ability against an alkali developer and is instable against an acid.

3. The composition according to claim 1, wherein the acid generator (B) is a compound having a diazomethanedisulfonyl skeleton, a disulfone-based compound or a sulfonic acid-based compound.

4. The composition according to claim 1, wherein Z in the formula (I) is an imino group, a carbonyl group, a sulfide group or a disulfide group.

5. The composition according to claim 4, wherein the dipyridyl compound (C) is 2,2'-dipyridylamine, di-2-pyridyl ketone, 4,4'-dipyridylsulfide or 2,2'-dipyridyldisulfide.

6. The composition according to claim 1 which comprises 20 to 98% by weight of the resin (A), 0.05 to 20% by weight of the acid generator (B) and 0.001 to 10% by weight of the dipyridyl compound (C) based on the total solid component weight of the composition.

7. The composition according to claim 1 which further comprises an electron donor (D) having an oxidation-reduction potential of not more than 1.7 eV.

8. The composition according to claim 7 which comprises 0.001 to 10% by weight of the electron donor (D) based on the total solid component weight of the composition.

* * * * *